(12) United States Patent
Zhang et al.

(10) Patent No.: US 12,507,584 B2
(45) Date of Patent: Dec. 23, 2025

(54) DISPLAY PANEL AND METHOD OF FABRICATING THE SAME

(71) Applicant: Hefei Visionox Technology Co., Ltd., Anhui (CN)

(72) Inventors: Haohan Zhang, Anhui (CN); Hui Li, Anhui (CN); Weili Li, Anhui (CN); Mingxing Liu, Anhui (CN); Shuaiyan Gan, Anhui (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 402 days.

(21) Appl. No.: 18/175,823

(22) Filed: Feb. 28, 2023

(65) Prior Publication Data

US 2023/0209984 A1 Jun. 29, 2023

Related U.S. Application Data

(63) Continuation of application No. PCT/CN2021/115343, filed on Aug. 30, 2021.

(30) Foreign Application Priority Data

Nov. 18, 2020 (CN) .......................... 202011296021.4

(51) Int. Cl.
*H10K 77/10* (2023.01)
*G02F 1/1333* (2006.01)
(Continued)

(52) U.S. Cl.
CPC ...... *H10K 77/111* (2023.02); *G02F 1/133305* (2013.01); *H10K 59/873* (2023.02); *H10K 71/00* (2023.02)

(58) Field of Classification Search
CPC ............ G01F 1/1333; G01F 1/133305; G01F 1/13351; H10K 50/84; H10K 59/00; Y02P 70/50
(Continued)

(56) References Cited

U.S. PATENT DOCUMENTS

2012/0061664 A1 3/2012 Yamazaki et al.
2019/0252415 A1 8/2019 Wan et al.
(Continued)

FOREIGN PATENT DOCUMENTS

CN 109301085 A 2/2019
CN 109585462 A 4/2019
(Continued)

OTHER PUBLICATIONS

International Search Report mailed Dec. 13, 2021, in International Application No. PCT/CN2021/115343, 6 pages.
(Continued)

*Primary Examiner* — Fazli Erdem
(74) *Attorney, Agent, or Firm* — Maier & Maier, PLLC (57) ABSTRACT

A method of fabricating a display panel, and a display panel. The method of fabricating a display panel includes: forming a flexible substrate layer and a patterned barrier layer on a substrate, the patterned barrier layer includes a first annular opening surrounding the hole region; etching the flexible substrate layer under shielding of the patterned barrier layer to form a patterned flexible substrate layer, the patterned flexible substrate layer includes a first sacrificial portion formed in the hole region and a body portion formed in the display region, and a second annular opening is formed between the body portion and the first sacrificial portion; forming a device layer on a side of the patterned barrier layer away from the patterned flexible substrate layer to form a (Continued)

semi-finished product of the display panel; and stripping the substrate to remove the substrate.

14 Claims, 6 Drawing Sheets

(51) Int. Cl.
  *H10K 59/80* (2023.01)
  *H10K 71/00* (2023.01)
(58) Field of Classification Search
  USPC .......................................................... 257/40
  See application file for complete search history.

(56) References Cited

U.S. PATENT DOCUMENTS

2020/0152894 A1\* 5/2020 Zhang ..................... H10K 59/12
2020/0328267 A1 10/2020 Li et al.

FOREIGN PATENT DOCUMENTS

| | | |
|---|---|---|
| CN | 109768188 A | 5/2019 |
| CN | 110187580 A | 8/2019 |
| CN | 110311061 A | 10/2019 |
| CN | 110459694 A | 11/2019 |
| CN | 110828519 A | 2/2020 |
| CN | 111509136 A | 8/2020 |
| CN | 111554831 A | 8/2020 |
| CN | 111799374 A | 10/2020 |
| CN | 112397675 A | 2/2021 |
| KR | 20090010763 A | 1/2009 |
| WO | 2019218637 A1 | 11/2019 |

OTHER PUBLICATIONS

Office Action issued on Mar. 3, 2022, in corresponding Chinese Application No. 202011296021.4, 11 pages.
Notification to Grant issued on Jun. 29, 2022, in corresponding Chinese Application No. 202011296021.4, 7 pages.

\* cited by examiner

DISPLAY PANEL AND METHOD OF FABRICATING THE SAME

CROSS-REFERENCE TO RELATED APPLICATION

The present application is a continuation of International Application No. PCT/CN2021/115343 filed on Aug. 30, 2021, which claims priority to Chinese Patent Application No. 202011296021.4, filed on Nov. 18, 2020 and entitled "DISPLAY PANEL AND METHOD OF FABRICATING THE SAME", both of which are hereby incorporated by reference in their entireties.

TECHNICAL FIELD

The present application relates to a technical field of electronic products, and in particular to a method of fabricating a display panel, and a display panel.

BACKGROUND

At present, mobile terminals are developing towards full screens, but the existence of cameras and sensors limits the increase of the screen-to-body ratio of the mobile terminals. Before the emergence and maturity of an effective scheme of camera under screen, the opening technology of the display region will be one of the technologies commonly used in the mobile terminals in recent years. However, the widely used opening scheme of the display region is laser punching. When designing the frame of the display region, in order to ensure the efficiency of screen packaging, large space must be set aside to prevent the influence of laser cutting. Therefore, the width of the frame of the display region having the opening will increase, which is not conducive to improving the screen-to-body ratio and screen aesthetics of the mobile terminals.

Therefore, a new display panel and a new fabrication method of the display panel are urgently needed.

SUMMARY

The present application provides a fabrication method of a display panel, and a display panel. The annular opening surrounding the hole region formed by etching effectively eliminates the thermal influence of laser cutting, and the accuracy of the etching is higher than the accuracy of the laser cutting, which effectively reduces the width of the frame of the hole region and improves the packaging reliability.

In a first aspect, an embodiment of the present application provides a fabrication method of a display panel, wherein the display panel includes a hole region and a display region surrounding the hole region, and the fabrication method includes: forming a flexible substrate layer and a patterned barrier layer on a substrate, wherein the patterned barrier layer includes a first annular opening surrounding the hole region; etching the flexible substrate layer under shielding of the patterned barrier layer to form a patterned flexible substrate layer, wherein the patterned flexible substrate layer includes a first sacrificial portion formed in the hole region and a body portion formed in the display region, and a second annular opening is formed between the body portion and the first sacrificial portion; forming a device layer on a side of the patterned barrier layer away from the patterned flexible substrate layer to form a semi-finished product of the display panel, wherein the device layer includes a display function portion located in the display region and a second sacrificial portion formed within the second annular opening and above the first sacrificial portion; stripping the substrate to remove the substrate as well as the first sacrificial portion, the second sacrificial portion, and the patterned barrier layer corresponding to the hole region and above the substrate.

In a second aspect, an embodiment of the present application provides a display panel fabricated by using the fabrication method according to any one of the above embodiments.

Compared with the related art, according to the fabrication method of the display panel provided by the embodiments of the present application, the flexible substrate layer and the patterned barrier layer are firstly formed on the substrate, wherein the patterned barrier layer includes the first annular opening surrounding the hole region. Under shielding of the patterned barrier layer, the flexible substrate layer is etched to form the patterned flexible substrate layer. The body portion and the first sacrificial portion of the patterned flexible substrate layer are separated through the second annular opening. Then, the formed device layer includes the display function portion located in the display region and the second sacrificial portion formed within the second annular opening and above the first sacrificial portion. That is, by means of etching, the film layers located in the display region and the film layers located in the hole region are separated. Finally, the substrate is stripped to remove the substrate as well as the first sacrificial portion, the second sacrificial portion, and the patterned barrier layer corresponding to the hole region and above the substrate, thereby achieving the opening process of the display panel. Compared with the scheme of forming the opening by laser cutting in the related art, according to the fabrication method of the display panel provided by the embodiments of the present application, the annular opening surrounding the hole region formed by etching effectively eliminates the thermal influence of laser cutting. Further, the accuracy of the etching is higher than the accuracy of the laser cutting, which effectively reduces the width of the frame of the hole region and improves the packaging reliability.

DETAILED DESCRIPTION

Features and exemplary embodiments of various aspects of the present application are described in detail below. In order to clarify the purposes, technical solutions and advantages of the present application, the present application will be further described in detail below in combination with the accompanying drawings and specific embodiments. It should be understood that the specific embodiments described herein are intended to interpret the present application and not to limit the present application. For those skilled in the art, the present application may be practiced without some of these specific details. The following description of the embodiments is merely to provide a better understanding of the present application by illustrating examples of the present application.

In order to better understand the present application, the fabrication method of fabricating the display panel and the display panel provided by the embodiments of the present application will be described in detail below with reference to FIGS. 1 to 12.

Please refer to FIGS. 1 to 8, the embodiments of the present application provide a fabrication method of fabricating a display panel, wherein the display panel includes a hole region TA and a display region AA surrounding the hole region TA, and the fabrication method includes steps S110 to S140.

Figure 1:
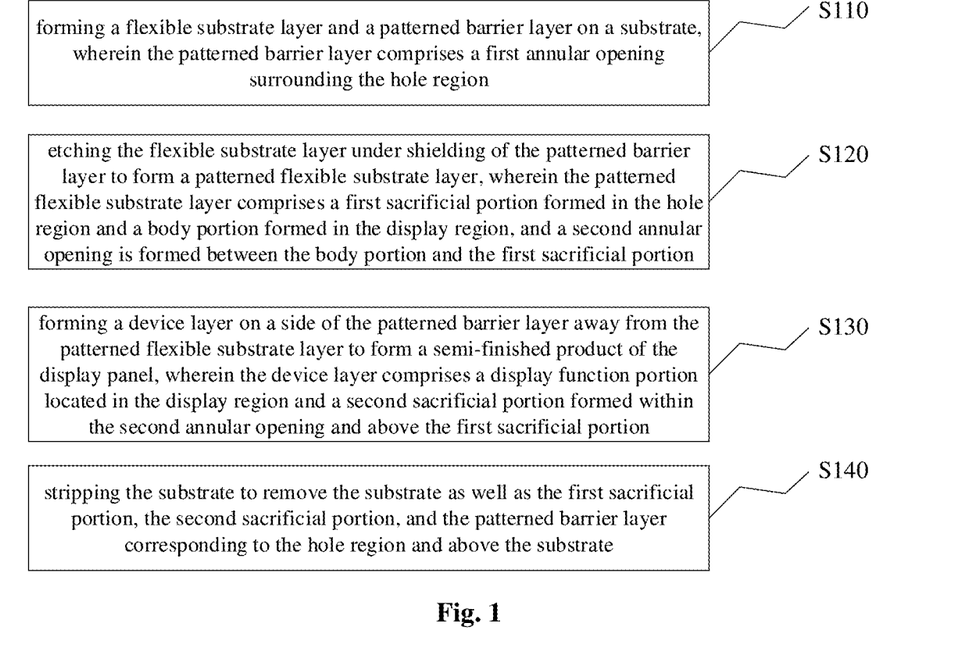
FIG. 1 is a flowchart of a fabrication method of a display panel according to an embodiment of the present application.
Figure 2:
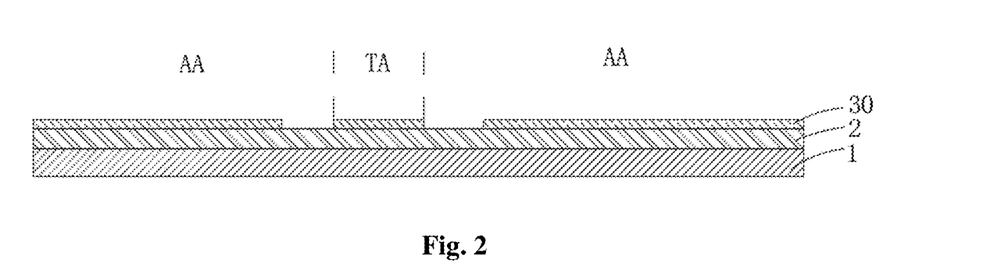
FIG. 2 is a film layer structural diagram of step S110 of the fabrication method of the display panel according to an embodiment of the present application.
Figure 3:
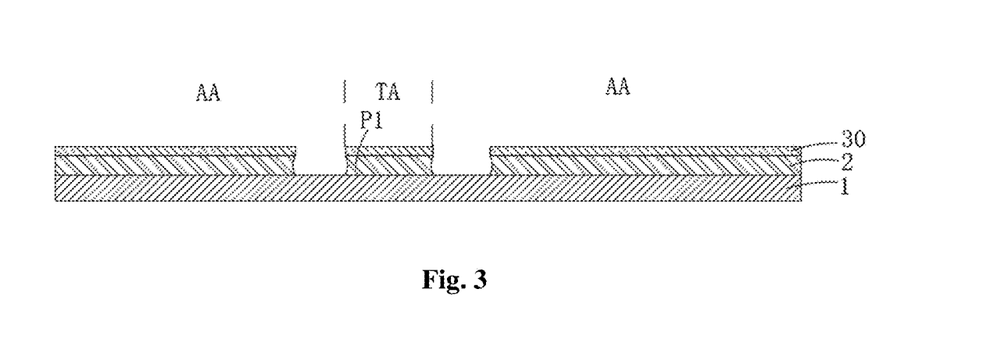
FIG. 3 is a film layer structural diagram of step S120 of the fabrication method of the display panel according to an embodiment of the present application.
Figure 4:
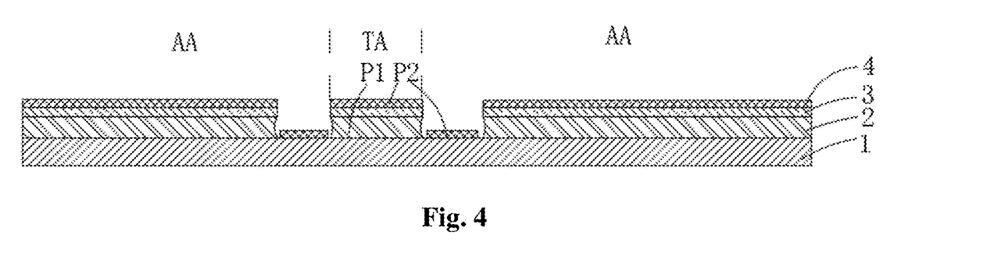
FIG. 4 is a film layer structural diagram of step S130 of the fabrication method of the display panel according to an embodiment of the present application.
Figure 5:
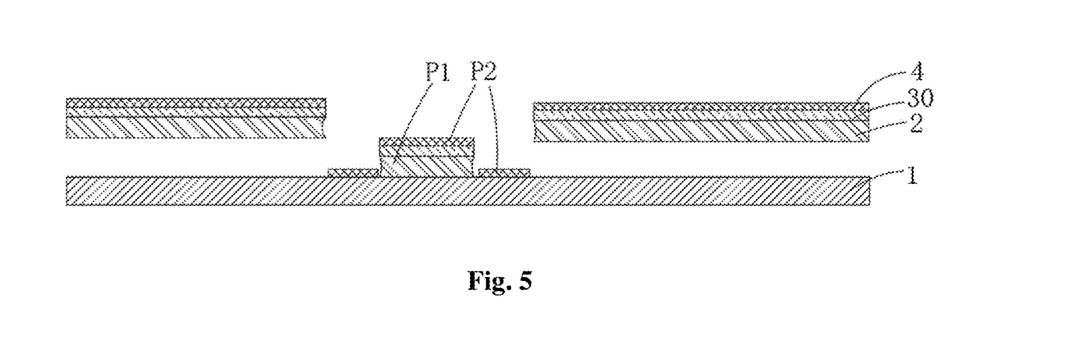
FIG. 5 is a film layer structural diagram of step S140 of the fabrication method of the display panel according to an embodiment of the present application.

As shown in FIG. 2, S110: forming a flexible substrate layer 2 and a patterned barrier layer 30 on a substrate 1, wherein the patterned barrier layer 30 includes a first annular opening surrounding the hole region TA;

As shown in FIG. 3, S120: etching the flexible substrate layer 2 under shielding of the patterned barrier layer 30 to form a patterned flexible substrate layer 2, wherein the patterned flexible substrate layer 2 includes a first sacrificial portion P1 formed in the hole region TA and a body portion formed in the display region AA, and a second annular opening is formed between the body portion and the first sacrificial portion P1;

As shown in FIG. 4, S130: forming a device layer 4 on a side of the patterned barrier layer 30 away from the patterned flexible substrate layer 2 to form a semi-finished product of the display panel, wherein the device layer 4 includes a display function portion located in the display region AA and a second sacrificial portion P2 formed within the second annular opening and above the first sacrificial portion P1;

As shown in FIG. 5, S140: stripping the substrate 1 to remove the substrate 1 as well as the first sacrificial portion P1, the second sacrificial portion P2, and the patterned barrier layer 30 corresponding to the hole region TA and above the substrate 1.

According to the fabrication method of fabricating the display panel provided by the embodiments of the present application, the flexible substrate layer 2 and the patterned barrier layer 30 are firstly formed on the substrate 1, wherein the patterned barrier layer 30 includes the first annular opening surrounding the hole region TA. Under shielding of the patterned barrier layer 30, the flexible substrate layer 2 is etched to form the patterned flexible substrate layer 2. The body portion and the first sacrificial portion P1 of the patterned flexible substrate layer 2 are separated through the second annular opening. Then, the formed device layer 4 includes the display function portion located in the display region AA and the second sacrificial portion P2 formed within the second annular opening and above the first sacrificial portion P1. That is, by means of etching, the film layers located in the display region AA and the film layers located in the hole region TA are separated. Finally, the substrate 1 is stripped to remove the substrate 1 as well as the first sacrificial portion P1, the second sacrificial portion P2, and the patterned barrier layer 30 corresponding to the hole region TA and above the substrate 1, thereby achieving the opening process of the display panel.

Compared with the scheme of forming the opening by laser cutting in the related art, according to the fabrication method of fabricating the display panel provided by the embodiments of the present application, the annular opening surrounding the hole region TA formed by etching effectively eliminates the thermal influence of laser cutting. Further, the accuracy of the etching is higher than the accuracy of the laser cutting, which effectively reduces the width of the frame of the hole region to and improves the packaging reliability.

In step S110, the patterned barrier layer 30 includes the first annular opening surrounding the hole region TA, and the shape of the first annular opening generally matches the shape of the hole region TA. Specifically, under a condition that the hole region TA is circular, the first annular opening is a circular annular opening with an inner diameter greater than an inner diameter of the hole region TA. Similarly, under a condition that the hole region TA is square or other shape, the first annular opening corresponds to a rectangular ring or other shape.

The patterned barrier layer 30 is a barrier layer patterned by a process such as etching. Therefore, after being patterned, the patterned barrier layer 30 includes the first annular opening surrounding the hole region TA.

It should be noted that, specifically, the patterned barrier layer 30 can be fabricated from a hydrophobic material for isolating external water vapor and preventing water vapor from entering the display panel and from resulting in corrosion and other problems. Specifically, the material of the patterned barrier layer 30 can be a fluorocarbon polymer material, and the fluorocarbon polymer material is a fluorine-containing carbon polymer material. Because it contains fluorine, the surface energy is very low, and it is suitable for building superhydrophobic surfaces. The rough surface of the flexible substrate layer 2 acts together with the patterned barrier layer 30 of the fluorocarbon polymer material, thereby isolating the water vapor from the flexible substrate layer 2 and preventing the flexible substrate layer 2 from absorbing water vapor. It should be noted that the material of the patterned barrier layer 30 may also be other hydrophobic materials, for example, silane coupling agent materials.

In step S120, under shielding of the patterned barrier layer 30, the flexible substrate layer 2 is etched to form the patterned flexible substrate layer 2. No patterned barrier layer 30 shields the position where the first annular opening is located. Therefore, the flexible substrate layer 2 exposed by the first annular opening is etched to form the second annular opening, and the flexible substrate layer 2 is also separated into two portions (for example, the body portion and the first sacrificial portion P1) by the second annular opening. The body portion is located in the display region AA, and the first sacrificial portion P1 is located in the hole region TA. In addition, the shape and size of the first sacrificial portion P1 are defined by the first annular opening and the second annular opening.

It should be noted that the flexible substrate layer 2 can be etched by using dry etching or wet etching, such as chemical etching and plasma etching processes.

In step S130, the device layer 4 is formed on the side of the patterned barrier layer 30 away from the patterned flexible substrate layer 2. According to the type of the display panel, the device layer 4 may adopt an organic light emitting diode (OLED) layer or a liquid crystal layer, and may further include an array layer provided with thin film transistors. The device layer 4 is usually formed by an evaporation process. Therefore, due to the influence of the first annular opening and the second annular opening, the formed device layer 4 includes the display function portion located in the display region AA and the second sacrificial portion P2 formed within the second annular opening and above the first sacrificial portion P1.

Figure 6:
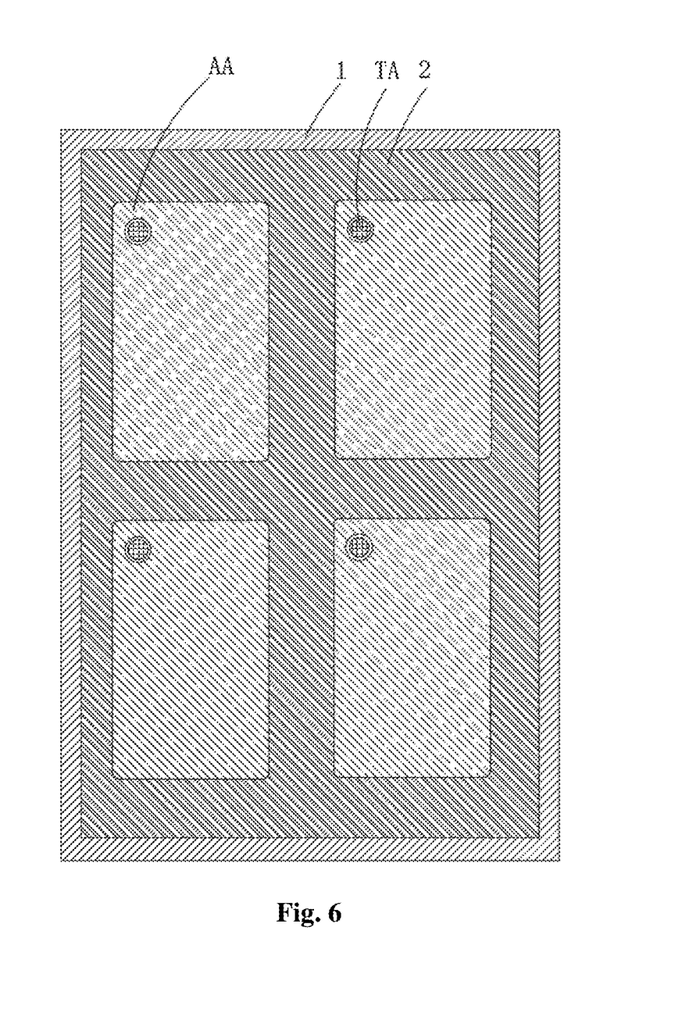
FIG. 6 is a schematic structural diagram of a display panel fabricated by the fabrication method, before stripping a substrate, according to an embodiment of the present application.
Figure 7:
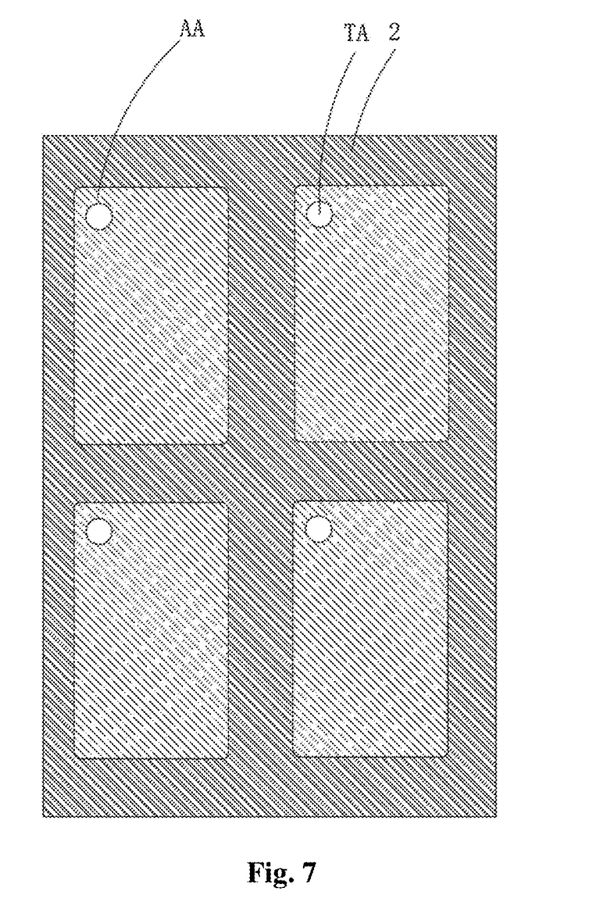
FIG. 7 is a schematic structural diagram of a flexible substrate layer of the display panel fabricated by the fabrication method, after stripping the substrate, according to an embodiment of the present application.
Figure 8:
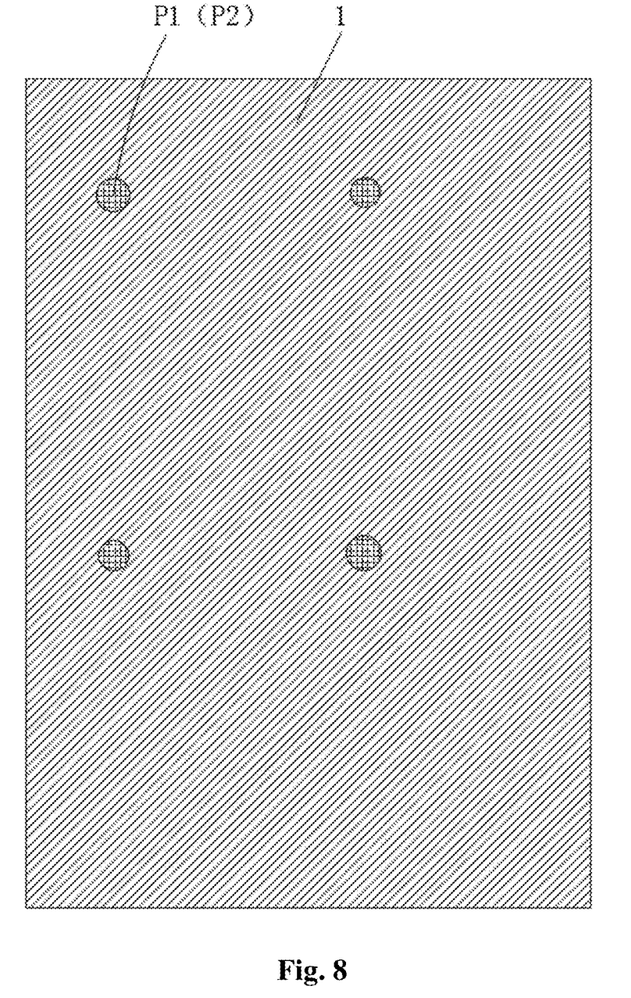
FIG. 8 is a schematic structural diagram of the substrate of the display panel fabricated by the fabrication method, after stripping the substrate, according to an embodiment of the present application.

Referring to FIGS. 6 to 8, in step S140, the substrate 1 is stripped to remove the substrate 1 as well as the first sacrificial portion P1, the second sacrificial portion P2, and the patterned barrier layer 30 corresponding to the hole region TA and above the substrate 1. As shown in FIG. 7, after stripping, the flexible substrate layer 2, the patterned barrier layer 30 and the device layer 4 located in the display region AA have the opening for arranging optical elements and the like. Here, the opening is formed by the first annular opening and the second annular opening and further by removing the first sacrificial portion P1, the second sacrificial portion P2 and the patterned barrier layer 30. As shown in FIG. 8, the stripped substrate 1 as well as the first sacrificial portion P1, the second sacrificial portion P2, and the patterned barrier layer 30 on the substrate 1 are illustrated.

In some alternative embodiments, forming the flexible substrate layer 2 and the patterned barrier layer 30 on the substrate 1 includes: forming a first substrate layer 21 on the substrate 1; and forming a second patterned barrier layer 6 on a side of the first substrate layer 21 away from the substrate 1. It can be understood that the flexible substrate layer 2 includes only one first substrate layer 21 and one second patterned barrier layer 6. Here, the process is simple and the material is saved, thereby effectively reducing cost.

Figure 9:
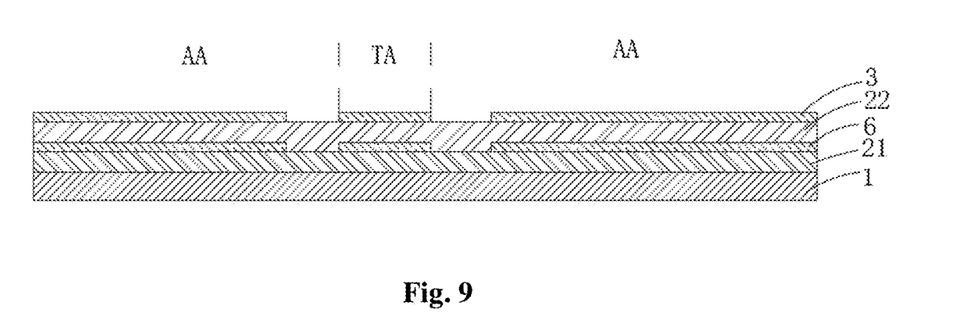
FIG. 9 is a film layer structural diagram in the fabrication method of the display panel according to an embodiment of the present application.

Referring to FIG. 9, in order to ensure the water vapor isolation properties of the display panel, in some alternative embodiments, after forming the second patterned barrier layer 6 on the side of the first substrate layer 21 away from the substrate 1, the fabrication method further includes: forming a second substrate layer 22 on a side of the second patterned barrier layer 6 away from the substrate 1; and forming a first patterned barrier layer 3 on a side of the second substrate layer 22 away from the substrate 1.

It can be understood that the flexible substrate layer 2 includes the first substrate layer 21 and the second substrate layer 22, that is, the flexible substrate layer 2 is a double-layer substrate structure with a better water vapor isolation effect. Meanwhile, the second patterned barrier layer 6 is disposed between the first substrate layer 21 and the second substrate layer 22 to further prevent water vapor intrusion. It should be noted that the first patterned barrier layer 3 and the second patterned barrier layer 6 both include the first annular opening. Specifically, the first substrate layer 21 and the second substrate layer 22 may adopt a flexible polyimide (PI) film with good insulation.

Figure 10:
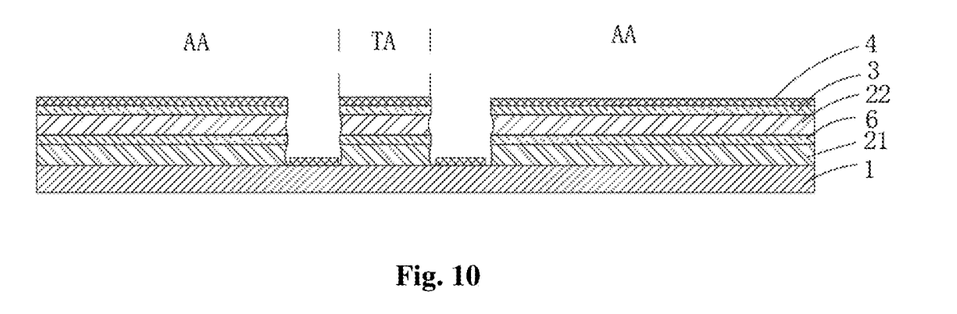
FIG. 10 is another film layer structural diagram in the fabrication method of the display panel according to an embodiment of the present application.

Referring to FIG. 10, in order to achieve the stripping of the substrate 1, in some embodiments, the first annular opening and the second annular opening are interconnected. That is, the first annular opening and the second annular opening are interconnected to form a large annular opening. The large annular opening completely separates the first sacrificial portion P1, the second sacrificial portion P2 and the first pattern barrier layer 3 located in the hole region TA from the film layers located in the display region AA, thereby facilitating the subsequent stripping process.

Optionally, orthographic projections of the first annular opening and the second annular opening on the substrate 1 completely overlap. That is, the shapes and sizes of the orthographic projections of the first annular opening and the second annular opening on the substrate 1 are identical. Further, the setting positions along a direction perpendicular to the display panel are also the same, and the space is effectively utilized to avoid creating the opening in a useless position and affecting the structural strength of the display panel.

Optionally, under a condition that the hole region TA is circular, the first annular opening and the second annular opening combine to form a complete circular annular opening surrounding the hole region TA, thereby realizing the function of dividing the display region AA and the hole region TA.

In order to ensure the packaging effect of the display panel, after forming the device layer 4 on the side of the patterned barrier layer 30 away from the patterned flexible substrate layer 2 and before stripping the substrate 1, the fabrication method further includes: forming an inorganic packaging layer 5 on a side of the device layer 4 away from the patterned flexible substrate layer 2 and on inner walls of the first annular opening and the second annular opening; and removing the inorganic packaging layer 5 on the device layer 4 exposed by the first annular opening and the second annular opening.

It should be noted that, due to the forming process, the inorganic packaging layer 5 will generally cover sidewalls of the device layer 4 and sidewalls of the film layers at the inner walls of the first annular opening and the second annular opening. That is, the inorganic packaging layer 5 connects the film layers of the hole region TA and the film layers of the display region AA. Specifically, the inorganic packaging layer 5 can adopt materials such as silicon nitride. Further, removing the inorganic packaging layer 5 on the device layer 4 exposed by the first annular opening and the second annular opening means that, the inorganic packaging layer 5 located on the sidewalls of the first annular opening and the second annular opening is remained. Therefore, the inorganic packaging layer 5 covers the sidewalls of the first annular opening and the second annular opening, which increases the packaging reliability.

Figure 11:
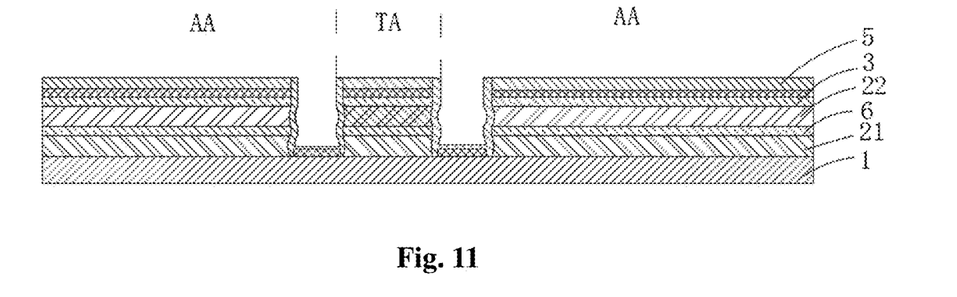
FIG. 11 is another film layer structural diagram in the fabrication method of the display panel according to an embodiment of the present application.

Referring to FIG. 11, in some alternative embodiments, forming the inorganic packaging layer 5 on the side of the device layer 4 away from the patterned flexible substrate layer 2 and on inner walls of the first annular opening and the second annular opening includes: forming the inorganic packaging layer 5 on the side of the device layer 4 away from the patterned flexible substrate layer 2 and on inner walls of the first annular opening and the second annular opening by a chemical vapor deposition process.

It should be noted that the chemical vapor deposition (CVD) technology is the main technology used to fabricate high-purity, high-performance solid thin films. In a typical CVD process, one or more vapor source atoms or molecules are introduced into the chamber, the chemical reaction occurs under external energy, and the required film is formed on the surface of the substrate. Therefore, the inorganic packaging layer 5 can be formed by the CVD technology.

Figure 12:
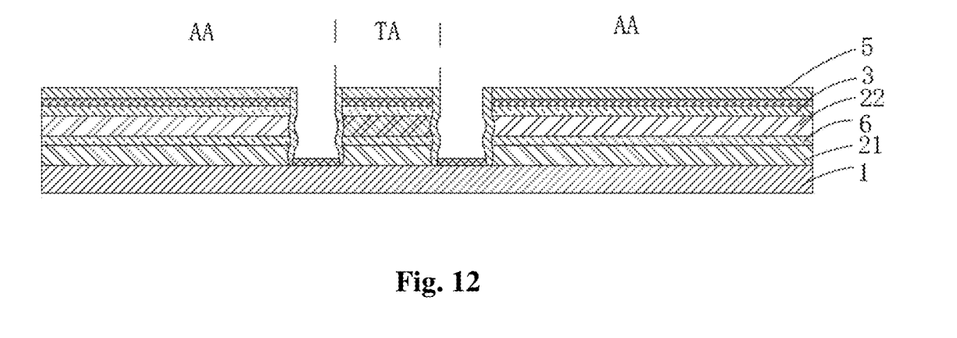
FIG. 12 is another film layer structural diagram in the fabrication method of the display panel according to an embodiment of the present application.

Referring to FIG. 12, in some embodiments, in order to prevent the inorganic packaging layer 5 located on the inner walls of the first annular opening and the second annular opening from affecting the stripping of substrate 1, removing the inorganic packaging layer 5 on the device layer 4 exposed by the first annular opening and the second annular opening includes: removing the inorganic packaging layer 5 on the device layer 4 exposed by the first annular opening and the second annular opening by dry etching or wet etching.

It should be noted that the difference between the dry etching and the wet etching is that the wet etching uses a solvent or a solution for etching. The wet etching is a pure chemical reaction process, which uses the chemical reaction between the solution and the material to be etched to remove the portion not masked by the mask film material, thereby achieving the purpose of etching. Specifically, the inorganic packaging layer 5 may be removed by using a solution that can chemically react with the material of the inorganic packaging layer 5. There are many kinds of dry etching, including light volatilization, vapor phase corrosion, plasma corrosion and the like, which can be selected according to the actual needs.

In order to achieve the stripping of the substrate 1, in some alternative embodiments, stripping the substrate 1 includes: separating the body portion and the display function portion located in the display region AA from the substrate 1 by a laser stripping process, to remove the substrate 1 as well as the first sacrificial portion P1, the second sacrificial portion P2, and the first patterned barrier layer 3 corresponding to the hole region TA and above the substrate 1.

Specifically, a laser is swept between the body portion and the substrate 1 to separate the body portion, the display function portion, and the film layers such as the patterned barrier layer 30 from the substrate 1, so as to remove the substrate 1 as well as the first sacrificial portion P1, the second sacrificial portion P2, and the first patterned barrier layer 3 corresponding to the hole region TA and above the substrate 1. Therefore, the opening process of the display panel is completed.

The embodiments of the present application also provide a display panel fabricated by using the fabrication method according to any one of the above embodiments. Optionally, the display panel also includes optical elements corresponding to the hole region TA.

It can be understood that, specifically, the optical element may be an element such as a camera. The display panel may be applied to a display device, such as a mobile terminal, a tablet computer, a computer monitor, a computer display, a television set, a wearable device, or an information query machine. The display device includes the display panel fabricated according to any embodiment of the present application. Therefore, the technical principles and the resulting effects are similar, which will not be repeated here.

The above are only specific implementations of the present application, those skilled in the art can clearly understand that the specific working processes of the above systems, modules and units can be referred to the corresponding processes in the foregoing method embodiments for the convenience and brevity of the description, which is not repeated here. It should be understood that the protection scope of the present application is not limited to this, and any person skilled in the art can easily think of various equivalent modifications or replacements within the technical scope disclosed in the present application, and these modifications or replacements should all be covered within the scope of protection of the present application.

It should also be noted that, according to the exemplary embodiments described in the present application, some methods or systems are described based on a series of steps or apparatuses. However, the present application is not limited to the above order of the steps, that is, the steps can be executed in the order described in the embodiments or in orders different from that in the embodiments, or several steps can be executed at the same time.

What is claimed is:

1. A method of fabricating a display panel, wherein the display panel comprises a hole region and a display region surrounding the hole region, and the method comprises:
   forming a flexible substrate layer and a patterned barrier layer on a substrate, wherein the patterned barrier layer comprises a first annular opening surrounding the hole region;
   etching the flexible substrate layer under shielding of the patterned barrier layer to form a patterned flexible substrate layer, wherein the patterned flexible substrate layer comprises a first sacrificial portion formed in the hole region and a body portion formed in the display region, and a second annular opening is formed between the body portion and the first sacrificial portion;
   forming a device layer on a side of the patterned barrier layer away from the patterned flexible substrate layer to form a semi-finished product of the display panel, wherein the device layer comprises a display function portion located in the display region and a second sacrificial portion formed within the second annular opening and above the first sacrificial portion;
   stripping the substrate to remove the substrate together with the first sacrificial portion, the second sacrificial portion, and the patterned barrier layer corresponding to the hole region and above the substrate, wherein the first sacrificial portion, the second sacrificial portion, and the patterned barrier layer remain fixed to the substrate.

2. The method according to claim 1, wherein forming the flexible substrate layer and the patterned barrier layer on the substrate comprises:
   forming a first substrate layer on the substrate;
   forming a second patterned barrier layer on a side of the first substrate layer away from the substrate, wherein the second patterned barrier layer comprises the first annular opening surrounding the hole region.

3. The method according to claim 2, wherein after forming the second patterned barrier layer on the side of the first substrate layer away from the substrate, the method further comprises:
   forming a second substrate layer on a side of the second patterned barrier layer away from the substrate;
   forming a first patterned barrier layer on a side of the second substrate layer away from the substrate, wherein the first patterned barrier layer comprises the first annular opening surrounding the hole region.

4. The method according to claim 2, wherein the first annular opening and the second annular opening are interconnected.

5. The method according to claim 4, wherein orthographic projections of the first annular opening and the second annular opening on the substrate completely overlap.

6. The method according to claim 2, wherein after forming the device layer on the side of the patterned barrier layer away from the patterned flexible substrate layer and before stripping the substrate, the method further comprises:
   forming an inorganic packaging layer on a side of the device layer away from the patterned flexible substrate layer and on inner walls of the first annular opening and the second annular opening;
   removing the inorganic packaging layer on the device layer exposed by the first annular opening and the second annular opening.

7. The method according to claim 6, wherein forming the inorganic packaging layer on the side of the device layer away from the patterned flexible substrate layer and on inner walls of the first annular opening and the second annular opening comprises:
   forming the inorganic packaging layer on the side of the device layer away from the patterned flexible substrate layer and on inner walls of the first annular opening and the second annular opening by a chemical vapor deposition process.

8. The method according to claim 6, wherein removing the inorganic packaging layer on the device layer exposed by the first annular opening and the second annular opening comprises:
   removing the inorganic packaging layer on the device layer exposed by the first annular opening and the second annular opening by dry etching or wet etching.

9. The method according to claim 1, wherein in the step of forming the flexible substrate layer and the patterned barrier layer on the substrate, wherein the patterned barrier layer comprises the first annular opening surrounding the hole region:
   a shape of the first annular opening matches a shape of the hole region.

10. The method according to claim 9, wherein under a condition that the hole region is circular, the first annular opening is a circular annular opening with an inner diameter greater than an inner diameter of the hole region.

11. The method according to claim 2, wherein stripping the substrate comprises:
    separating the body portion and the display function portion located in the display region from the substrate by a laser stripping process, to remove the substrate as well as the first sacrificial portion, the second sacrificial portion, and the patterned barrier layer corresponding to the hole region and above the substrate.

12. A display panel fabricated by using the method according to claim 1.

13. The method according to claim 1, wherein shapes and sizes of the openings defining the hole region are the same in a perpendicular direction.

14. The method according to claim 1, wherein the flexible substrate layer is separated into a body portion and the first sacrificial portion by the second annular opening, the body portion is located in the display region, and the first sacrificial portion is located in the hole region.

* * * * *